United States Patent
Song et al.

(10) Patent No.: US 8,659,223 B2
(45) Date of Patent: Feb. 25, 2014

(54) LIGHT EMITTING DIODE DISPLAY

(75) Inventors: Seung-Yong Song, Yongin (KR); Young-Seo Choi, Yongin (KR); Oh-June Kwon, Yongin (KR); Ji-Hun Ryu, Yongin (KR); Young-Cheol Joo, Yongin (KR); Sun-Young Jung, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 31 days.

(21) Appl. No.: 13/244,215

(22) Filed: Sep. 23, 2011

(65) Prior Publication Data

US 2012/0161620 A1    Jun. 28, 2012

(30) Foreign Application Priority Data

Dec. 24, 2010  (KR) .................. 10-2010-0134330

(51) Int. Cl.
  *H01L 51/50*  (2006.01)
  *H01L 51/52*  (2006.01)
(52) U.S. Cl.
  USPC ........................ 313/512; 313/506; 313/509
(58) Field of Classification Search
  USPC ................................................ 313/500–512
  See application file for complete search history.

(56) References Cited

U.S. PATENT DOCUMENTS

| | | | |
|---|---|---|---|
| 2003/0184221 A1* | 10/2003 | Mishima | 313/512 |
| 2007/0170324 A1* | 7/2007 | Lee et al. | 248/247 |
| 2007/0170455 A1* | 7/2007 | Choi et al. | 257/100 |
| 2007/0170855 A1* | 7/2007 | Choi et al. | 313/512 |
| 2011/0122100 A1* | 5/2011 | Lee et al. | 313/504 |

FOREIGN PATENT DOCUMENTS

| | | |
|---|---|---|
| JP | 2005-129515 A | 5/2005 |
| KR | 10-2008-0087257 A | 10/2008 |
| KR | 10-2009-0035275 A | 4/2009 |

* cited by examiner

*Primary Examiner* — Mariceli Santiago
(74) *Attorney, Agent, or Firm* — Knobbe Martens Olson & Bear LLP

(57) ABSTRACT

An organic light emitting diode (OLED) display is disclosed. In one embodiment, the OLED display includes i) a display substrate, ii) an OLED array, iii) an encapsulation substrate arranged opposite to the display substrate with respect to the OLED array, iv) a sealing member configured to seal the display substrate and the encapsulation substrate and v) a filler applied in a space formed between the display substrate and the encapsulation substrate. In one embodiment, the height of the filler is more than about 1.2 times the height of the OLED array.

15 Claims, 4 Drawing Sheets

LIGHT EMITTING DIODE DISPLAY

RELATED APPLICATIONS

This application claims priority to and the benefit of Korean Patent Application No. 10-2010-0134330 filed in the Korean Intellectual Property Office on Dec. 24, 2010, the entire content of which is incorporated herein by reference.

BACKGROUND

1. Field

The described technology generally relates to an organic light emitting diode (OLED) display, more particularly, to an OLED display having improved mechanical strength.

2. Description of the Related Technology

An OLED display is a self-emissive display that displays images using organic light emitting diodes.

The OLED display includes a display panel assembly that includes the OLEDs. Typically, a filler is used inside the display panel assembly to buffer external impact transmitted to the internals of the assembly.

SUMMARY

One inventive aspect is an organic light emitting diode (OLED) display having a display panel assembly filled with a sufficient amount of filler to buffer the components from mechanical shocks such as impacts.

Another aspect is an OLED display which includes a display substrate, an encapsulation substrate arranged opposite to the display substrate, a sealing member seals the display substrate and the encapsulation substrate, an organic light emitting diode array disposed on the display substrate, and a filler placed in a space formed between the display substrate and the encapsulation substrate. The height of the filler is more than about 1.2 times that of the OLED array.

The heights used in calculating the ratio may be the maximum heights of the filler and the array.

The maximum height of the filler may be a distance from the surface of the display substrate to the surface of the encapsulation substrate.

The maximum height of the organic light emitting diode array may be a distance from the surface of the display substrate to the surface of a layer arranged closest to the surface of the encapsulation substrate among a plurality of layers included in the organic light emitting diode array, and the layer may be a cathode.

The maximum height of the filler may be a distance from the surface of an interlayer insulating layer included in the organic light emitting diode array to the surface of the encapsulation substrate.

The maximum height of the organic light emitting diode array may be a distance from the surface of the interlayer insulating layer to the surface of a layer arranged closest to the surface of the encapsulation substrate among a plurality of layers included in the organic light emitting diode array, and the layer may be a cathode.

The height forming the volume of the filler may be less than 2.0 times of the height forming the volume of the organic light emitting diode array.

The filler may include a silicon-based material and the sealing member may be formed from a frit.

DETAILED DESCRIPTION

Figure 1:
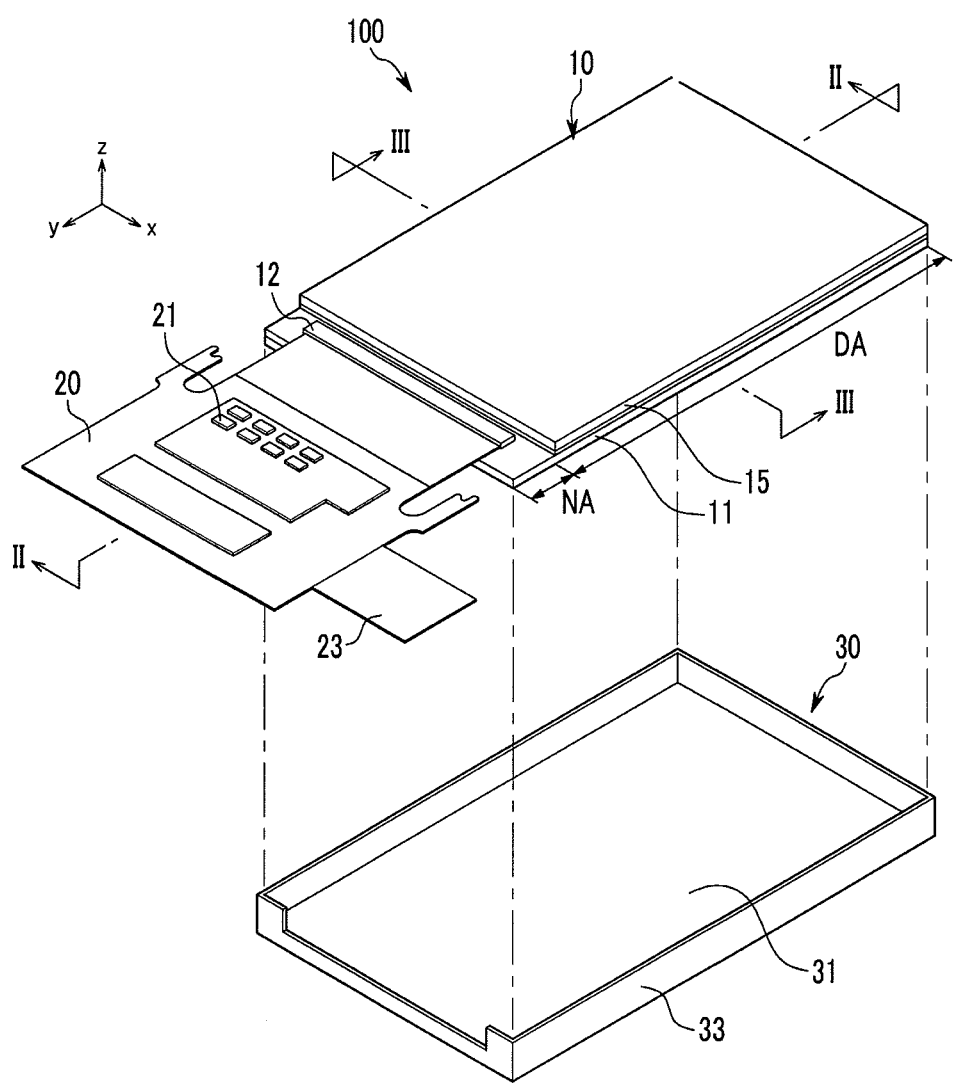
FIG. 1 is a partial exploded perspective view of an OLED display according to a first embodiment.

A filler material is generally used on an organic light emitting diode array to protect the OLEDs in the display panel assembly. When the amount of filler is insufficient, air bubbles are formed at a bent portion of the OLED array so that its mechanical strength may be compromised. Accordingly, a technique for sufficiently applying the filler in the display panel assembly is required.

Embodiments will be described more fully hereinafter with reference to the accompanying drawings.

The drawings and description are to be regarded as illustrative in nature and not restrictive. Like reference numerals designate like elements throughout the specification. The size and thickness of the components shown the drawings are optionally determined for better understanding and ease of description, and they are not considered limiting.

It will be understood that when an element such as a layer, film, region, or substrate is referred to as being "on" another element, it can be directly on the other element or intervening elements may also be present. Further, in the specification and the claims that follow, when it is described that an element is "coupled" to another element, the element may be "directly coupled" to the other element or "electrically coupled" to the other element through a third element.

Figure 2:
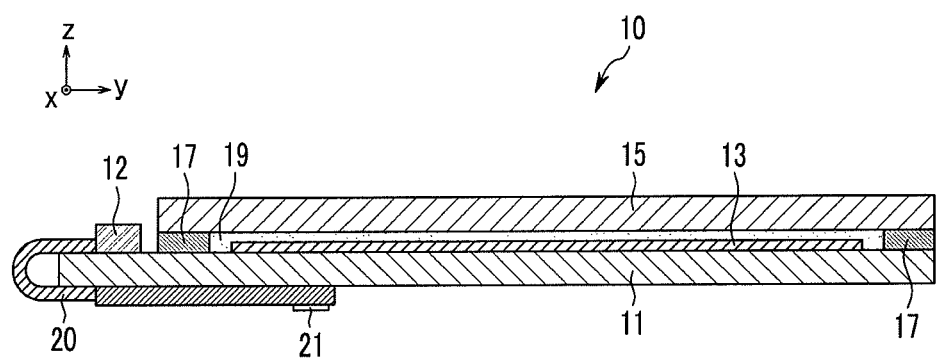
FIG. 2 is a cross-sectional view of the OLED display of FIG. 1, in the assembled state, taken along the line II-II.

FIG. 1 is a perspective view of an organic light emitting diode (OLED) display according to an embodiment, and FIG. 2 is a cross-sectional view of FIG. 1, taken along the line II-II.

As shown in FIG. 1 and FIG. 2, an OLED display 100 according to an embodiment includes a display area DA and a mounting area or non-display area NA, and the display area DA includes a display panel assembly 10 displaying a predetermined image and a support member 30 supporting the display panel assembly 10.

The display panel assembly 10 includes a display substrate 11, an organic light emitting diode array 13 disposed on the display substrate 11, an encapsulation substrate 15 disposed at an upper side of the display substrate 11 and the organic light emitting diode array 13, a sealing member 17 sealing the display substrate 11 and the encapsulation substrate 15, and a filler 19 disposed at a space between the display substrate 11 and the encapsulation substrate 15.

The display substrate 11 has a display area DA and a mounting area NA. In one embodiment, the encapsulation substrate 15 is smaller than the display substrate 11 in size, and is sealed to the display area DA of the display substrate 11. The display substrate 11 and the encapsulation substrate 15 are sealed to each other by the sealing member 17 disposed along the edge of the encapsulation substrate 15.

An integrated circuit chip 12 is mounted on the mounting area NA of the display substrate 11. In this case, the integrated circuit chip 12 is mounted on a side of the display substrate 11, which is in substantially the same direction of the side where the encapsulation substrate 15 is attached. That is, the encapsulation substrate 15 and the integrated circuit chip 12 closely neighbor with each other.

In addition, the display substrate 11 may further include a protection layer (not shown) that prevents corrosion from occurring in the mounting area NA while mechanically protecting the integrated circuit chip 12 by covering the mounting area NA.

The display substrate 11 may further include a scan driver (not shown) and a data driver (not shown) for driving pixels. In addition, the display substrate 11 further includes pad electrodes (not shown) disposed in the mounting area NA. In one embodiment, the integrated circuit chip 12 is mounted on the mounting area NA of the display 11 using a chip on glass (COG) method for electrical connection with the pad electrodes (not shown). The display substrate 11 further includes wires (not shown) connecting the integrated circuit chip 12, the scan driver (not shown), and the data driver (not shown) to each other.

The encapsulation substrate 15 is sealed to the display substrate 11 to protect the organic light emitting element L1 (refer to FIG. 3), thin film transistors T1 and T2 (refer to FIG. 3), and wires of the display substrate 11 from external environment.

A circuit board 20 includes a circuit part 21 for processing a driving signal and a connecter unit 23 for receiving an external signal. The circuit part 21 is formed of a plurality of parts for driving the OLED display 100. Here, the circuit board 20 may be formed with a flexible printed circuit (FPC) board.

At a rear side of the display panel assembly 10, a support member 30 for enhancing bending strength of the display panel assembly 10 may be disposed.

The support member 30 may include a bottom portion 31 and a skirt portion 33 protruded from an edge of the bottom portion 31. The support member 30 may be made of at least one of a resin-based material including polycarbonate (PC) and a metal-based material including stainless steel (SUS), aluminum (Al), and an alloy thereof.

The OLED display 100 may further include an adhesive member (not shown) disposed between the bottom portion 31 of the supporting member 30 and the display panel assembly 10. The adhesive member may couple the display panel assembly 10 and the support member 30 to each other.

Hereinafter, the organic light emitting diode array 13 will be described in further detail with reference to FIG. 3 and FIG. 4.

Figure 3:
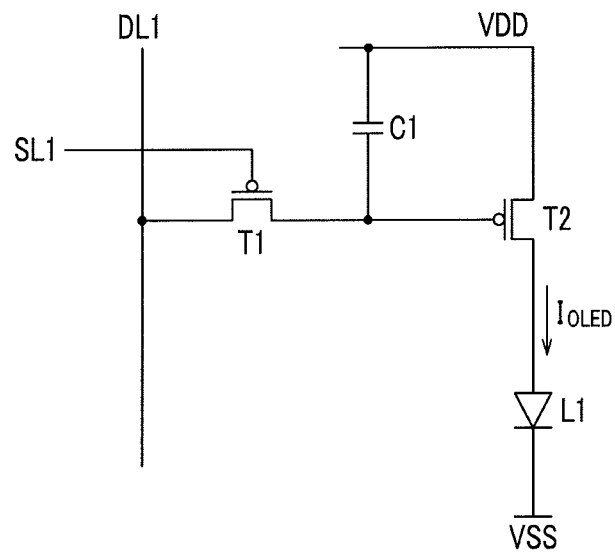
FIG. 3 is a layout view of a pixel circuit of a display panel assembly of FIG. 1.
Figure 4:
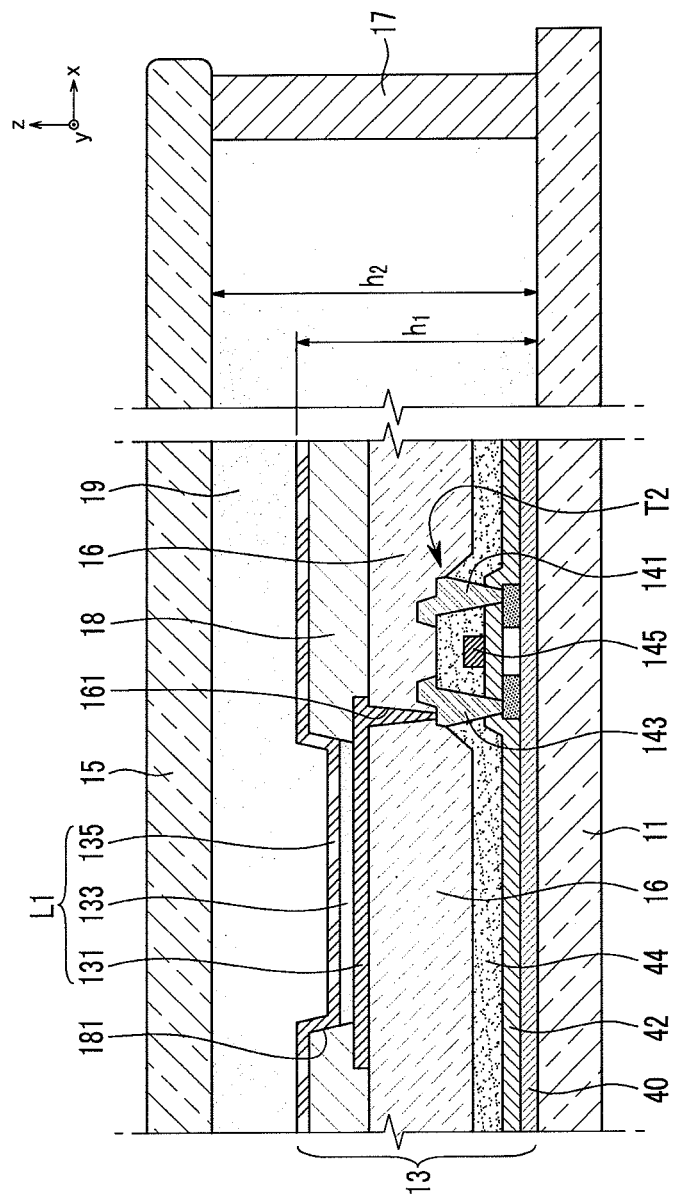
FIG. 4 is a partial cross-sectional view of the OLED display of FIG. 1, in the assembled state, taken along the line III-III.

FIG. 3 is a basic pixel circuit diagram of the organic light emitting array according to the present embodiment, and FIG. 4 is a cross-sectional view of FIG. 1, taken along the line III-III.

As shown in FIG. 3 and FIG. 4, the organic light emitting diode array 13 includes an organic light emitting element L1 and a driving circuit. The organic light emitting element L1 includes an anode (hole injection electrode) 131, an organic emission layer 133, and a cathode (electron injection electrode) 135. In addition, the organic light emitting diode array 13 includes at least two thin film transistors T1 and T2 and at least one storage capacitor C1. The at least two thin film transistors include a switching transistor T1 and a driving transistor T2. The switching transistor T1 is electrically connected to a scan line SL1 and a data line DL1, and transmits a data voltage input to the data line DL1 according to a switching voltage input to the scan line SL1 to the driving transistor T2. The storage capacitor C1 is electrically connected to the switching transistor T1 and a power line VDD, and stores a voltage corresponds to a difference between a voltage transmitted from the switching transistor T1 and a voltage supplied to the power line VDD.

The driving transistor T2 is electrically connected to the power line VDD and the storage capacitor C1 and supplies an output current that is substantially proportional to the square of a difference between the voltage stored in the storage capacitor C1 and a threshold voltage to the organic light emitting element L1, and the organic light emitting element L1 emits light by the output current. The driving transistor T2 includes a source electrode 141, a drain electrode 143, and a gate electrode 145, and the anode 131 of the organic light emitting element L1 may be connected to the drain electrode 143 of the driving transistor T2.

A planarization layer 16 is disposed on a source electrode 141 and the drain electrode 143 of the driving transistor T2, and the anode 131 is formed on the planarization layer 16. A via hole 161 is formed in the planarization layer 16 such that the anode 131 is connected with the drain electrode 143 through the via hole 161. A pixel defining layer 18 is disposed on the anode 131 and the planarization layer 16. The pixel defining layer 18 forms an opening 181 at a portion overlapping with the anode 131 to expose the anode 131 therethrough. In addition, the organic emission layer 133 is filled in the opening 181 of the pixel defining layer 18 such that it contacts the anode 131.

The organic emission layer 133 may be substantially the same as the pixel defining layer 18 in size, or may be larger than the opening of the pixel defining layer 18 in size.

In addition, the organic light emitting diode array 13 may further include a buffer layer 40, a gate insulating layer 42, and an interlayer insulating layer 44 that are sequentially formed on the display substrate 11.

In the organic light emitting element L1, the anode 131 is formed with a metal layer having a characteristic of light reflection and the cathode 135 is formed with a transparent conductive layer. Thus, light emitted from the organic emission layer 133 passed through the cathode 135 and the encapsulation substrate 15 and then emitted to the outside, and the anode 131 reflects light emitted toward the encapsulation substrate 15 among light emitted from the organic emission layer 133 to the encapsulation substrate 15 to thereby enhance luminous efficiency. In this case, the anode 131 reflects not only the light of the organic emission layer 133 but also external light.

The sealing member 17 seals the display substrate 11 and the encapsulation substrate 15, and may be formed with a frit in the present embodiment. A space is formed between the display substrate 11 and the encapsulation substrate 15 sealed by the sealing member 17, excluding a portion where the organic light emitting diode array 13 is disposed, and the filler 19 (refer to FIG. 2) is filled in the space.

The filler 19 protects the display panel assembly 10 from external impact to thereby improve mechanical reliability of the OLED display 100. In the present embodiment, the filler 19 may be made of an organic sealant such as urethane-based resin, epoxy-based resin, acryl-based resin or an inorganic sealant such as silicon. The urethane-based resin may include, for example, urethane acrylate. The acryl-based resin may include, for example, butyl acrylate and ethylhexyl acrylate.

In one embodiment, the filler 19 is charged with the optimal state in the space to protect the display panel assembly 10. That is, when the space between the organic light emitting diode array 13 and the encapsulation substrate 15 is not sufficiently filled with the filler 19, air bubbles may be formed between interfaces of the organic light emitting diode array 13 and the filler 19 or in the filler 19, and accordingly the display panel assembly 10 cannot be safely protected from external impact due to the defective filler 19.

Hereinafter, the charging condition of the filler 19 with respect to the space will be described in further detail.

Referring to FIG. 4, the filler 19 and the organic light emitting diode array 13 respectively have a predetermined volume in the space between the display substrate 11 and the encapsulation substrate 15. In this case, when the volume corresponds to a product of a horizontal direction (i.e., a short side length of the display panel assembly in the x-axis direction of FIG. 1), a vertical length (i.e., a long side length of the display panel assembly in the y-axis direction of FIG. 1), and a height (i.e., the height of the display panel assembly in the z-axis direction of FIG. 1), a height $h_2$ of the filler 19 is about 1.2 times of a height $h_1$ of the organic light emitting diode array 13.

Here, the height $h_1$ of the organic light emitting diode array 13 and the height $h_2$ of the filler 19 respectively refer to the maximum height of the organic light emitting diode array 13 and the maximum height of the filler 19 among heights forming the volumes of the organic light emitting diode array 13 the filler 19. That is, the organic light emitting diode array 13 has a multi-layered structure and the surface contacting the filler 19 may be bent according to a detailed structure of each layer, and accordingly the height forming the volume of the organic light emitting diode array 13 may not be fixed. The height $h_1$ of the organic light emitting diode array 13 is the highest one among inconsistent heights.

Corresponding to this, the height of the filler 19, forming the volume thereof may not be consistent. The height $h_2$ of the filler 19 is the highest one among inconsistent heights.

In the present embodiment, the maximum height $h_1$ of the organic light emitting element may correspond to a distance from the surface of the encapsulation substrate 15 among the layers of the organic light emitting diode array 13 to the surface of the closest layer, that is, the cathode 135.

Figure 5:
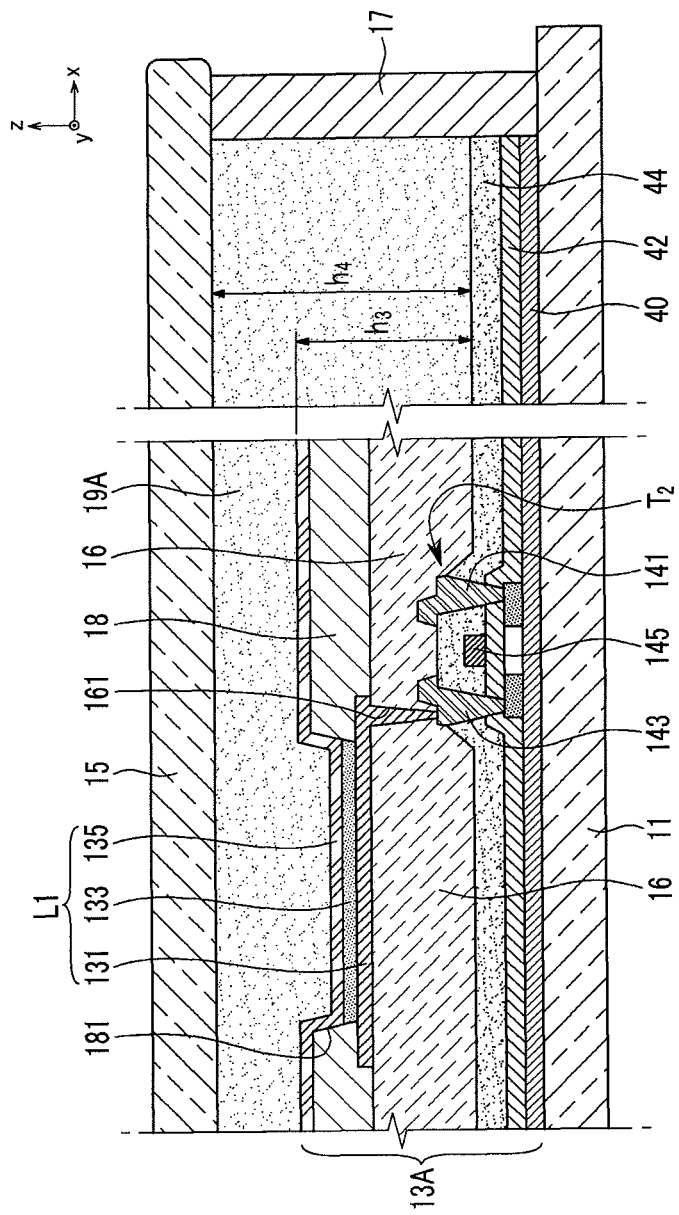
FIG. 5 is a partial cross-sectional view of an OLED display according to a second embodiment.

FIG. 5 is a partial cross-sectional view of an OLED display according to a second embodiment, and an OLED display 200 according to the second embodiment has the same structure of the OLED display of the first embodiment.

In the second embodiment, the height of an organic light emitting diode array 13A and the height of a filler 19A are different from those of the first embodiment. That is, a distance from the surface of an interlayer insulating layer 44 to the surface of a cathode 135 that is the closest layer of an encapsulation substrate 15 is set to the maximum height $h_3$ of the organic light emitting diode array 13A, and a distance from the surface of the interlayer insulating layer 44 to the surface of the encapsulation substrate 15 is set to the maximum height $h_4$ of the filler 19A. As in the second embodiment, the height $h_4$ of the filler 19A is about 1.2 times of the height $h_3$ of the organic light emitting diode array 13A.

Further, in the present embodiments, the heights $h_2$ and $h_4$ of the fillers 19 and 19A may be two times smaller than the heights $h_1$ and $h_3$ of the organic light emitting element arrays 13 and 13A.

In one embodiment, the height relation range (i.e., about 1.2 times to about 2 times) of the filler and the organic light emitting element array is set considering that external image applied to the display panel assembly 10 may not be effectively absorbed when the range is less than about 1.2 times such that the organic light emitting diode array 13 may be damaged and, when the range exceeds about 2.0 times, the display panel assembly 10 cannot be effectively formed as user desired.

Table 1 shows the results of measuring a bending strength characteristic of the display panel assembly 10 in the case that the height of the organic light emitting diode array of the OLED display is 4.5 μm. In the present embodiment, only the height of the display substrate 11 was considered. That is, the width and the length of the display substrate 11 are not considered. That is, volume=width×length×height, but the weight and the length are charged according to the size of the display substrate 11 so that they are excluded in the consideration.

TABLE 1

|  | Height of filler | average(N) |
| --- | --- | --- |
| Comparative Example 1 | Sealing substrate without filler | 42.13 |
| Comparative Example 2 | 4.5 μm | 42.33 |
| Embodiment 1 | 5.4 μm | 47.24 |

As shown in Table 1, when the height of the organic light emitting diode array is 4.5 μm, the height of the filler is set to 5.4 μm (Embodiment 1). In this case, the height of the filler is 1.2 times of the height of the organic light emitting element array. On the contrary, when the height of the filler and the height of the organic light emitting diode array were equally set to 4.5 μm (Comparative Example 2), the bending strength was 42.33N and when the substrate was sealed without the filler (Comparative Example 1). That is, the bending strengths were similar to each other. However, in the case of Embodiment 1, the bending strength was 47.24N, which is improved than the bending strengths of the Comparative Examples. As described, when the height of the filler 19 is determined to be about 1.2 times higher than the height of the organic light emitting diode array 13, the mechanical strength of the display panel assembly 10 is significantly increased.

In Table 1, the height of the organic light emitting diode array was 4.5 μm and the height of the filler was 5.4 μm for embodiment, but the height of the organic light emitting diode array may be set to about 7.5 μm and the height of the filler may be set to about 9 μm according to another embodiment. When the height of the filler is relatively high, that is, when the inner space of the display panel assembly is filled with a large amount of filler, the inner space can be prevented from being partially empty, thereby maintaining the outer appearance of the OLED display in good condition.

According to at least one of the disclosed embodiments, the amount of the filler applied in a space between the display substrate and the encapsulation substrate is optimized to enhance the mechanical strength of the OLED display with respect to external impact.

While embodiments have been described in connection with the accompanying drawings, it is to be understood that the disclosed embodiments are not considered limiting, but, on the contrary, various modifications and equivalent arrangements are included within the spirit and scope of the appended claims.

What is claimed is:

1. An organic light emitting diode (OLED) display comprising:
   a display substrate;
   an OLED array;
   an encapsulation substrate arranged opposite to the display substrate with respect to the OLED array;
   a sealing member configured to seal the display substrate and the encapsulation substrate; and
   a filler applied in a space formed between the display substrate and the encapsulation substrate, wherein the height of the filler is 1.2 times the height of the OLED array.

2. The OLED display of claim 1, wherein the filler height is the maximum height of the filler and wherein the array height is the maximum height of the OLED array.

3. The OLED display of claim 2, wherein the filler height is the distance between the display substrate and the encapsulation substrate.

4. The OLED display of claim 3, wherein the array height is the distance between the display substrate and a first layer arranged closest to the encapsulation substrate among a plurality of layers included in the OLED array.

5. The OLED display of claim 4, wherein the first layer is a cathode.

6. The OLED display of claim 2, wherein the filler height is the distance between an interlayer insulating layer included in the OLED array and the encapsulation substrate.

7. The OLED display of claim 6, wherein the array height is the distance between the interlayer insulating layer and a second layer arranged closest to the encapsulation substrate among a plurality of layers included in the OLED array.

8. The OLED display of claim 7, wherein the second layer is a cathode.

9. The OLED display of claim 3, wherein the filler height is about 9 μm.

10. The OLED display of claim 5, wherein the array height is about 7.5 μm.

11. An organic light emitting diode (OLED) display comprising:
   a display substrate;
   an OLED array;
   an encapsulation substrate arranged opposite to the display substrate with respect to the OLED array;
   a sealing member configured to seal the display substrate and the encapsulation substrate; and
   a filler applied in a space formed between the display substrate and the encapsulation substrate, wherein the height of the filler is about 1.2 times the height of the OLED array,
   wherein the filler height is the maximum height of the filler and wherein the array height is the maximum height of the OLED array,
   wherein the filler height is the distance between an interlayer insulating layer included in the OLED array and the encapsulation substrate, and
   wherein the filler height is about 5.4 μm.

12. An organic light emitting diode (OLED) display comprising:
   a display substrate;
   an OLED array;
   an encapsulation substrate arranged opposite to the display substrate with respect to the OLED array;
   a sealing member configured to seal the display substrate and the encapsulation substrate; and
   a filler applied in a space formed between the display substrate and the encapsulation substrate, wherein the height of the filler is about 1.2 times the height of the OLED array,
   wherein the filler height is the maximum height of the filler and wherein the array height is the maximum height of the OLED array,
   wherein the filler height is the distance between an interlayer insulating layer included in the OLED array and the encapsulation substrate,
   wherein the array height is the distance between the interlayer insulating layer and a second layer arranged closest to the encapsulation substrate among a plurality of layers included in the OLED array,
   wherein the second layer is a cathode, and
   wherein the array height is about 4.5 μm.

13. The OLED display of claim 1, wherein the filler includes a silicon-based material.

14. The OLED display of claim 1, wherein the sealing member is a frit.

15. An organic light emitting diode (OLED) display comprising:
   a display substrate;
   an OLED array;
   an encapsulation substrate arranged opposite to the display substrate with respect to the OLED array;
   a sealing member configured to seal the display substrate and the encapsulation substrate; and
   a filler applied in a space formed between the display substrate and the encapsulation substrate, wherein the height of the filler is 1.2 times the height of the OLED array, wherein the filler height is the maximum height of the filler and wherein the array height is the maximum height of the OLED array, and wherein the array height is the distance between an interlayer insulating layer and a second layer arranged closest to the encapsulation substrate among a plurality of layers included in the OLED array.

* * * * *